United States Patent
Racz (10) Patent No.: US 10,224,478 B2
(45) Date of Patent: Mar. 5, 2019

(54) MAGNETIC FIELD SENSOR WITH INTEGRATED FIELD CONCENTRATORS

(71) Applicant: Melexis Technologies SA, Bevaix (CH)

(72) Inventor: Robert Racz, Zug (CH)

(73) Assignee: Interglass Technology AG (CH)

( * ) Notice: Subject to any disclaimer, the term of this patent is extended or adjusted under 35 U.S.C. 154(b) by 0 days.

(21) Appl. No.: 15/601,803

(22) Filed: May 22, 2017

(65) Prior Publication Data

US 2017/0352800 A1  Dec. 7, 2017

(30) Foreign Application Priority Data

Jun. 6, 2016 (CH) .......................... 719/16

(51) Int. Cl.
| | |
|---|---|
| *H01L 43/02* | (2006.01) |
| *H01L 43/04* | (2006.01) |
| *G01R 33/02* | (2006.01) |
| *G01R 33/00* | (2006.01) |
| *H01L 27/22* | (2006.01) |

(52) U.S. Cl.
CPC .......... *H01L 43/02* (2013.01); *G01R 33/0011* (2013.01); *G01R 33/0206* (2013.01); *H01L 43/04* (2013.01); *H01L 27/22* (2013.01)

(58) Field of Classification Search
None
See application file for complete search history.

(56) References Cited

U.S. PATENT DOCUMENTS

| | | |
|---|---|---|
| 5,691,637 A | 11/1997 | Oswald et al. |
| 5,942,895 A | 8/1999 | Popovic et al. |
| 6,501,268 B1 | 12/2002 | Edelstein et al. |
| 6,545,462 B2 | 4/2003 | Schott et al. |
| 7,235,968 B2 | 6/2007 | Popovic et al. |
| 2011/0309829 A1 | 12/2011 | Loreit et al. |
| 2013/0141090 A1 | 6/2013 | Sidman |

FOREIGN PATENT DOCUMENTS

| | | |
|---|---|---|
| EP | 1746426 A1 | 1/2007 |
| GB | 2505226 A | 8/2012 |
| JP | S56-96663 U | 7/1981 |
| JP | 2002-71381 A | 2/2002 |
| WO | 2006/083479 A1 | 8/2006 |
| WO | 20120116933 A1 | 7/2012 |

OTHER PUBLICATIONS

JPO Notification of Reason for Refusal (related case: JP 2017-096178), Japanese Patent Office, dated Jun. 12, 2018, pp. 1-3 (English Translation).

*Primary Examiner* — Bo B Jang
(74) *Attorney, Agent, or Firm* — CanaanLaw, P.C.; David B. Ritchie (57) ABSTRACT

A one-dimensional magnetic field sensor comprises a support, a single elongated magnetic field concentrator or two magnetic field concentrators, which are separated by a first gap, and at least one magnetic sensor element. The magnetic field concentrator, or both thereof, consists of at least two parts which are separated from each other by second gaps. A two-dimensional magnetic field sensor comprises a support, a single magnetic field concentrator which consists of at least three parts which are separated from each other by gaps, and at least two magnetic sensor elements.

4 Claims, 9 Drawing Sheets

MAGNETIC FIELD SENSOR WITH INTEGRATED FIELD CONCENTRATORS

PRIORITY CLAIM

Applicant hereby claims foreign priority under 35 U.S.C. § 119 from Swiss Patent Application No. 719/16 filed Jun. 6, 2016, the disclosure of which is herein incorporated by reference.

FIELD OF THE INVENTION

The invention relates to a magnetic field sensor with integrated magnetic field concentrators.

BACKGROUND OF THE INVENTION

A one-dimensional magnetic field sensor is known from U.S. Pat. No. 5,942,895, which comprises two horizontal Hall elements and two elongated magnetic field concentrators. The two magnetic field concentrators are separated by an air gap. The two Hall elements are arranged at the edge of the air gap and are coupled in an anti-parallel manner. The magnetic field sensor detects only one component of the magnetic field, namely the one which extends parallel to the longitudinal direction of the two magnetic field concentrators.

A two-dimensional magnetic field sensor is known from U.S. Pat. No. 6,545,462, which comprises at least two horizontal Hall elements and a disc-shaped magnetic field concentrator. The Hall elements are arranged beneath the edge of the magnetic field concentrator. The magnetic field sensor detects two components of the magnetic field, from which the direction of the magnetic field is determined.

A current sensor is known from European patent publication EP 1746426, which comprises a one-dimensional magnetic field sensor with one or two elongated magnetic field concentrators and at least one vertical Hall element.

The Hall elements are integrated in the active surface of a semiconductor chip, typically in CMOS technology, and the magnetic field concentrators are arranged on the active surface.

It is important in some applications of these magnetic field sensors, e.g. in current sensors, that the magnetic field concentrators produce a high amplification of the magnetic field to be measured on the one hand, since a high amplification factor means a relatively high signal-to-noise ratio or high resolution capability, and that the magnetic field concentrators on the other hand reach saturation only at the highest possible magnetic field strength so that the linear measuring range is as large as possible.

BRIEF DESCRIPTION OF THE INVENTION

The invention is based on the recognition that the saturation limit of the magnetic field concentrators of said magnetic field sensors and thus the linear measuring range increases when the magnetic field concentrator or the magnetic field concentrators are subdivided into two or more parts which are separated from each other by a comparatively narrow gap. The subdivision of the magnetic field concentrator or magnetic field concentrators into several segments produces the following:

- a more homogeneous distribution of the magnetic field in the individual parts of the magnetic field concentrator or magnetic field concentrators, which produces the increase in the saturation limit;
- a reduction of the amplification factor, and
- a reduction of the mechanical stress which produces undesirable offset and sensitivity drifts as well as undesirable magnetic hysteresis effects.

The magnetic field sensors comprise a support, on which one or more magnetic field concentrators are arranged and rigidly connected to the support, and one or more magnetic sensor elements. The support can, for example, be a semiconductor chip, into which the magnetic sensor elements are integrated or on which they are arranged.

A one-dimensional magnetic field sensor comprises in a first embodiment precisely two magnetic field concentrators which are separated by a first gap. At least one magnetic sensor element is arranged in the region of the first gap between the two magnetic field concentrators, where it is flooded by magnetic field lines which originate from the one magnetic field concentrator and impinge on the other magnetic field concentrator. The two magnetic field concentrators each consist of at least two parts which are separated from each other by second gaps. The width of the second gaps is smaller than the width of the first gap, which also allows determining the individual parts of the two magnetic field concentrators in an unambiguous manner.

A one-dimensional magnetic field sensor comprises in a second embodiment a single, elongated magnetic field concentrator. A first magnetic sensor element is arranged in the region of one longitudinal end of the magnetic field concentrator, where it is flooded by magnetic field lines which originate from the magnetic field concentrator in the region of the longitudinal end. Optionally, a second magnetic sensor element is arranged in the region of the other longitudinal end of the magnetic field concentrator and is differentially coupled to the first sensor element. The magnetic field concentrator consists of at least two parts which are separated from each other by gaps.

A two-dimensional magnetic field sensor comprises a single magnetic field concentrator and at least two magnetic sensor elements which are arranged in the region of the edge of the magnetic field concentrator. The magnetic field concentrator consists of at least three parts which are separated from each other by gaps.

All parts of the magnetic field concentrators are rigidly connected to the support.

When the magnetic field sensor is packaged in a housing, typically an IC housing of plastic material, the gaps are usually filled with plastic from the housing material.

The term "first gap" is used to denote a gap between two different magnetic field concentrators, while the terms "second gaps" or "gaps" are used to denote the gap or gaps between individual parts of a magnetic field concentrator. The sensor elements lie outside of the gaps both in the one-dimensional magnetic field sensors and also in the two-dimensional magnetic field sensor, such that they are not flooded by field lines which originate from mutually opposite edges of the individual parts of the magnetic field concentrator(s). No magnetic sensor elements are thus present in the region of the gaps between the individual parts of said magnetic field concentrators. The gaps are further as thin as is possible from a technological standpoint, i.e. typically they are only approximately 5 to 20 µm wide. The said first gap between the two magnetic field concentrators of the first embodiment of the one-dimensional magnetic field sensor is comparatively wider, i.e. typically it is 30 to 40 µm wide or even wider.

The invention will be explained below in closer detail by reference to embodiments and the drawings.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are schematic for reasons of clarity of the illustrations and are not shown true to scale. The explanations concerning the figures are based on a Cartesian coordinate system whose three axes are designated as X-axis, Y-axis and Z-axis. The Z-axis extends perpendicularly to the plane of the drawing. For reasons of illustrative clarity, the reference symbol for same objects is sometimes only entered once.

In the drawings.

DETAILED DESCRIPTION OF THE INVENTION

The invention will now be described in more detail with reference to one-dimensional and two-dimensional magnetic field sensors.

One-Dimensional Magnetic Field Sensor

Figure 1:
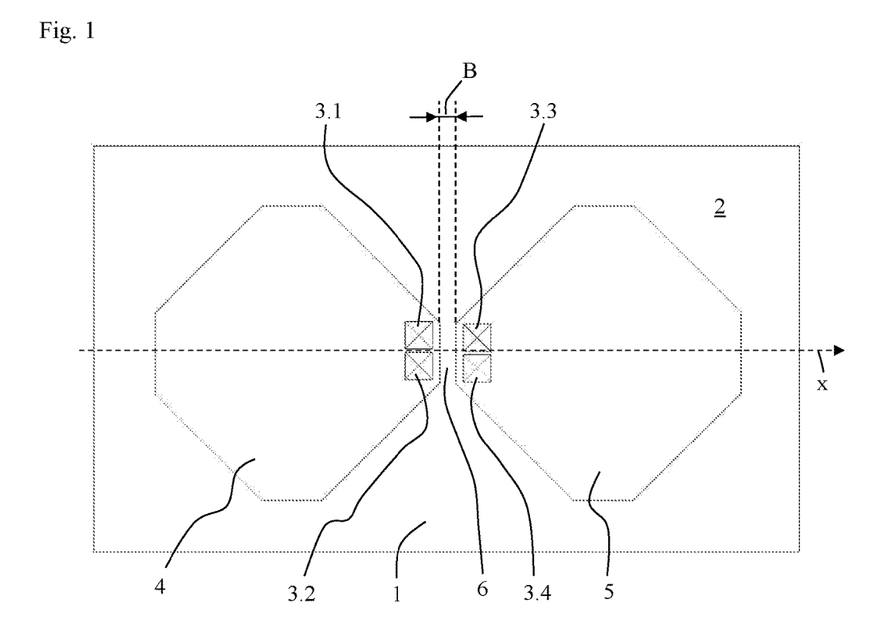
FIG. 1 shows a one-dimensional magnetic field sensor according to the prior art.

FIG. 1 schematically shows the structure of a one-dimensional magnetic field sensor according to the prior art (according to the principle described in EP 772046). The magnetic field sensor comprises a semiconductor chip 1 with an active surface 2, in which four horizontal Hall elements, namely the Hall elements 3.1 to 3.4, are embedded, and two magnetic field concentrators 4 and 5, which are arranged on the active surface 2 of the semi-conductor chip 1 and are separated by a first gap 6. The two magnetic field concentrators 4 and 5 are arranged along the X-axis and are formed symmetrically in relation to the X-axis. The magnetic field sensor detects the component of the magnetic field which points in the direction of the X-axis. The two Hall elements 3.1 and 3.2 are arranged in the region of the edge of the first magnetic field concentrator 4, where they are flooded by field lines of the magnetic field which point in the negative Z-direction. The two Hall elements 3.3 and 3.4 are arranged in the region of the edge of the second magnetic field concentrator 5, where they are flooded by field lines of the magnetic field which point in the positive Z-direction. The two Hall elements 3.1 and 3.2 form a first pair or a first cluster, and they are coupled in parallel with respect to each other. The two Hall elements 3.3 and 3.4 form a second pair or a second cluster, and they are coupled in parallel with respect to each other and antiparallel to the Hall elements 3.1 and 3.2 of the first pair in order to combine the four output signals of the Hall elements 3.1 to 3.4 with correct sign to a single output signal which is proportional to the X-component of the magnetic field. The first gap 6 has a predetermined width B. The magnetic field concentrators 4 and 5 have two functions. On the one hand, they rotate the magnetic field to be measured locally from the X-direction to the Z-direction and thus allow its measurement with a horizontal Hall element which is sensitive to the component of the magnetic field which points in the Z-direction. On the other hand, they amplify the magnetic field at the location of the Hall elements 3.1 to 3.4 by a factor G.

Figure 2:
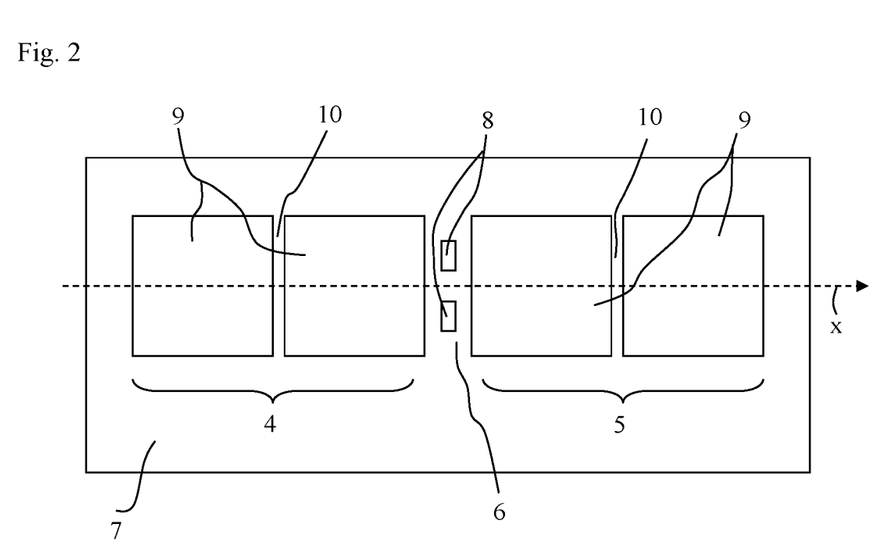
FIG. 2 shows a one-dimensional magnetic field sensor according to the invention.

FIG. 2 schematically shows a one-dimensional magnetic field sensor in accordance with the invention. The magnetic field sensor comprises a support 7, precisely two magnetic field concentrators 4 and 5 as well as one or more magnetic sensor elements 8. The magnetic field concentrators 4 and 5 are fixedly arranged on the support 7 and separated by a first gap 6. Each sensor element 8 is arranged at a predetermined location in the region of the first gap 6 in such a way that it is flooded by magnetic field lines which originate from the one magnetic field concentrator 4 and impinge on the other magnetic field concentrator 5. A sensor element 8, which is sensitive to the X-component of the magnetic field, must be arranged where the magnetic field lines extend in the X-direction, i.e. approximately in the middle between the magnetic field concentrators 4 and 5, whereas a sensor element 8 which is sensitive to the Z-component of the magnetic field must be arranged where the magnetic field lines extend in the Z-direction, i.e. at the edge of the magnetic field concentrators 4 or 5 facing the first gap 6. If the magnetic field sensor comprises more than one sensor element 8, the output signals of the sensor elements 8 are added with correct sign to form an output signal of the magnetic field sensor.

The magnetic field concentrators 4 and 5 consist of a material with high magnetic permeability. High permeability shall be understood as a relative permeability of at least 100 (the relative permeability of air is 1). The material is permalloy or mu-metal or amorphous magnetic glass for example whose relative permeability typically lies in the range of between 100 and 100,000. The two magnetic field concentrators 4 and 5 are used for amplifying the magnetic field to be measure and to concentrate it at the location or locations where the sensor element 8 or the sensor elements 8 is or are arranged.

Each of the two magnetic field concentrators 4 and 5 consists of at least two parts 9, which are separated from each other by a second gap 10. The width of the second gaps 10 is smaller than the width of the first gap 6, which separates the two magnetic field concentrators 4 and 5 from each other. The subdivision of the magnetic field concentrators 4 and 5 into two or more parts 9 ensures that the mechanical stress is reduced which is produced during changes in temperature as a result of the different thermal coefficients of expansion of the material of the support 7 and the material of the magnetic field concentrators 4 and 5.

The magnetic field concentrators 4 and 5 can have an elongated rectangular shape (as shown in FIG. 2) or an elongated elliptical shape and be subdivided into two or three or more parts 9.

The parts 9, i.e. all parts 9, are rigidly connected to the support 7 in this embodiment and in all following embodiments of the invention. They are thus immobile.

Figure 3:
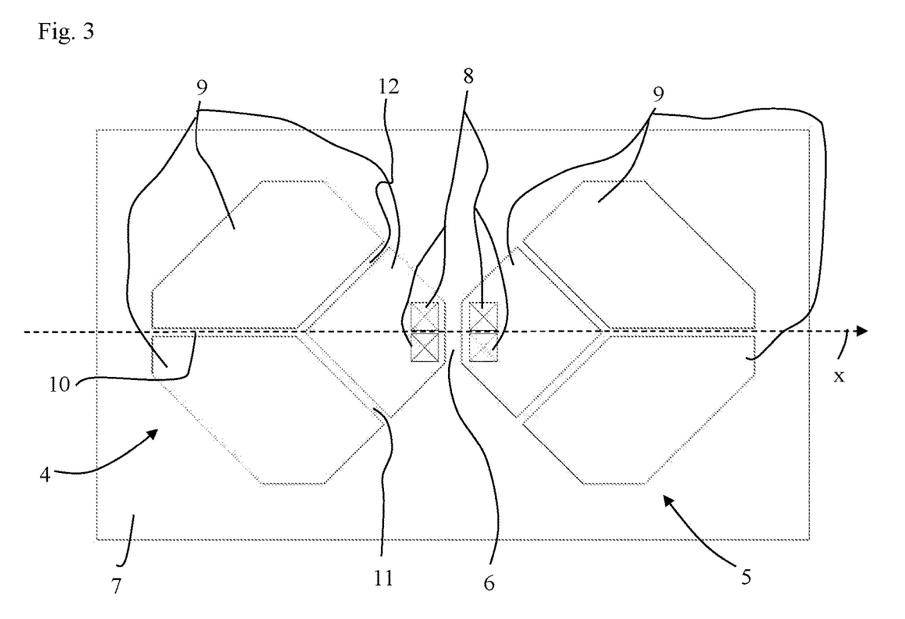
FIGS. 3, 4 show preferred embodiments of a one-dimensional magnetic field sensor according to the invention.
Figure 4:
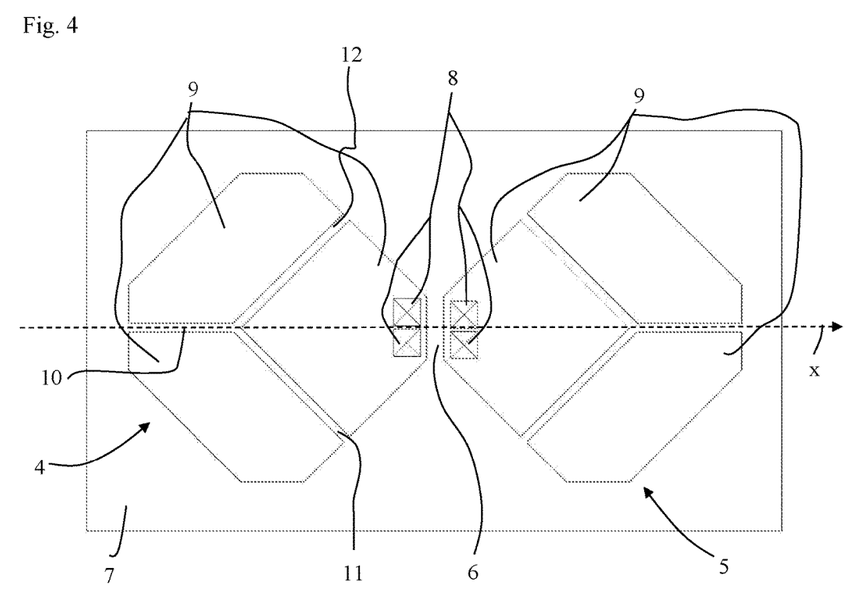

FIGS. 3 and 4 show two preferred embodiments of a one-dimensional magnetic field sensor, in which each of the magnetic field concentrators 4 and 5 is subdivided into three parts 9. The two magnetic field concentrators 4 and 5 have an octahedral shape (with different side lengths) and are arranged symmetrically in relation to the X-axis. The three parts 9 are separated from each other by second gaps 10, 11 and 12. The second gaps 10, 11 and 12 have a width $B_1$, $B_2$ and $B_3$. The widths $B_1$, $B_2$ and $B_3$ are comparatively small in relation to the width B of the first gap 6. They are typically smaller by a factor of 3 to 10.

Figure 5:
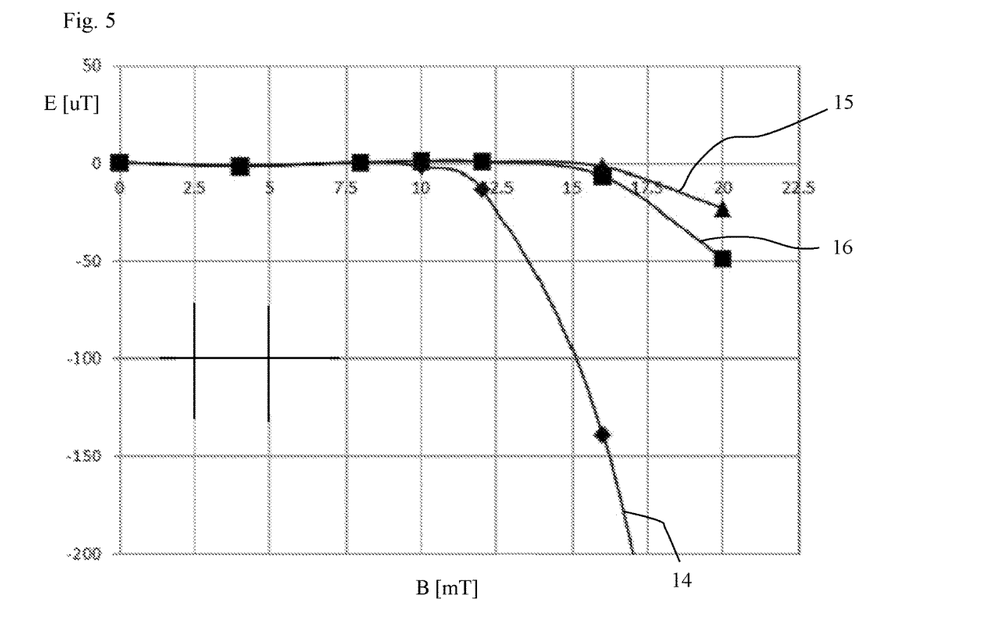
FIG. 5 shows linearity errors of the magnetic field sensors according to FIGS. 1, 3 and 4.

The second gaps 10, 11 and 12 produce a change in the distribution of the magnetic field lines in addition to stress reduction, with the consequence that the amplification factor decreases on the one hand and the magnetic saturation limit increases on the other hand. The increase in the saturation limit means that the magnetic field concentrators 4 and 5 reach saturation at higher field strengths, which consequently leads to a respective increase in the linear measuring range. The amplification factor G has a value of $G \cong 6$ when the magnetic field concentrators 4, 5 are present in an integral form, as shown in FIG. 1. In an embodiment of the magnetic field concentrators 4, 5, which are in tripartite form as shown in FIGS. 3 and 4, the amplification factor G has a smaller value, namely a value of $G \cong 4.1$ in the embodiment according to FIG. 3 or a value of $G \cong 4.5$ in the embodiment according to FIG. 4. FIG. 5 shows the linearity error E in function of the magnetic field strength B for the three embodiments, namely in form of curves 14, 15 and 16 which are associated with the embodiments of FIGS. 1, 3 and 4. In the embodiment according to the prior art as shown in FIG. 1, linearity errors already appear at a field strength of approximately 10 mT, which then increase strongly at the latest from approximately 12 mT. In the embodiments according to FIGS. 3 and 4, linearity errors only appear from approximately 15 mT, wherein they increase more rapidly in the embodiment according to FIG. 4 than in the embodiment according to FIG. 3. Linearity errors occur when first areas of the magnetic field concentrators 4 and 5 magnetically come into saturation and increase the greater the saturated areas become. The amplification factor G and the saturation limit are strongly coupled: the greater the amplification factor the lower the saturation limit and accordingly the smaller the linear measuring range and vice versa. By optimal subdivision of the magnetic field concentrators 4, 5 into two or more segments, the linear measuring range can be increased by a greater factor than the reduction in the amplification factor, which means higher efficiency.

The magnetic field concentrators 4 and 5 shown in FIGS. 3 and 4 can also be subdivided into more than three parts 9.

Figure 6:
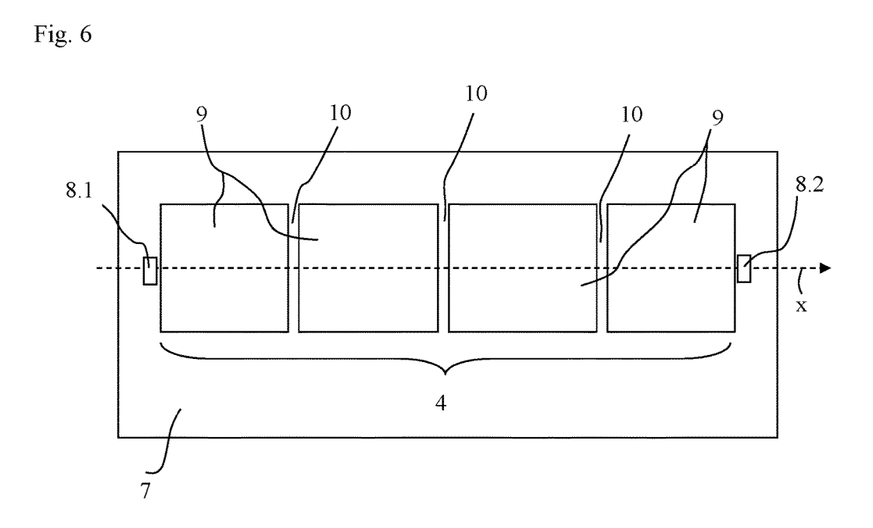
FIG. 6 shows a further one-dimensional magnetic field sensor according to the invention.

FIG. 6 shows a one-dimensional magnetic field sensor with a single, elongated magnetic field concentrator 4. As is illustrated, the magnetic field concentrator 4 is rectangular, but it can also have any other elongated form, e.g. an elliptical form. The magnetic field concentrator 4 is arranged on the support 7. The magnetic field sensor comprises a first magnetic sensor element 8.1 which is arranged in the region of the one longitudinal end of the magnetic field concentrator 4, and optionally a second magnetic sensor element 8.2, which is arranged in the region of the other longitudinal end of the magnetic field concentrator 4. The sensor elements 8.1 and 8.2 are flooded by magnetic field lines, which in the region of the longitudinal ends of the magnetic field concentrator 4 impinge on said concentrator or originate therefrom. The magnetic field concentrator consists of at least two parts 9, which are separated from each other by gaps 10. No magnetic sensor element is present in the region of the gaps 10. If both magnetic sensor elements 8.1 and 8.2 are present, their output signals are coupled differentially to form a single output signal. Such a magnetic field sensor can be used in a current sensor for example.

The magnetic field concentrator 4 can also have a shape other than the elongated geometry, e.g. it can be round. If both are present, the two magnetic sensor elements 8.1 and 8.2 are preferably diametrically opposite each other.

Two-Dimensional Magnetic Field Sensor

Figure 7:
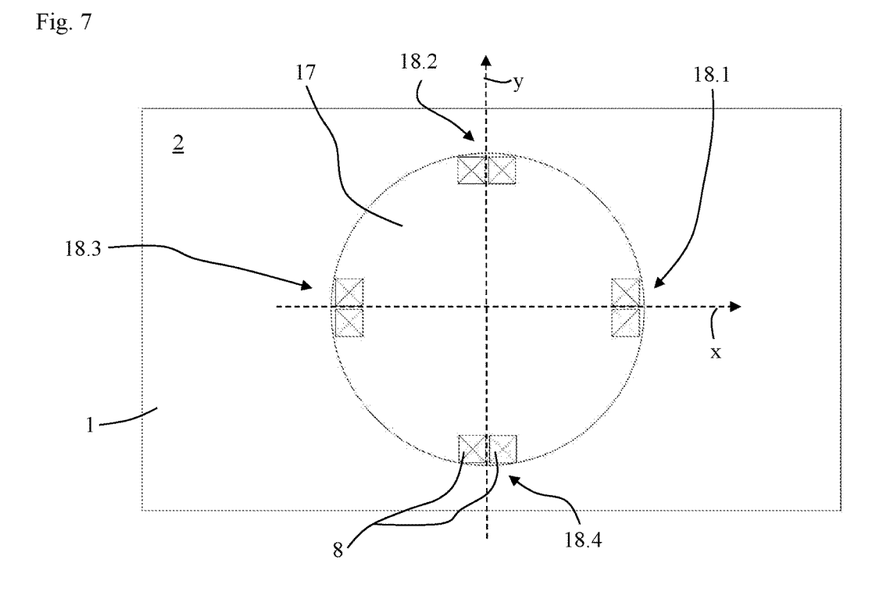
FIG. 7 shows a two-dimensional magnetic field sensor according to the prior art.

FIG. 7 shows the structure of a two-dimensional magnetic field sensor according to the prior art (according to the principle described in EP 1182461). The magnetic field sensor comprises a semiconductor chip 1 with an active surface 2, in which eight horizontal Hall elements, which form four pairs or clusters 18.1 to 18.4, are embedded, and a circular magnetic field concentrator 17 which is arranged on the active surface 2 of the semiconductor chip 1. The shape of the magnetic field concentrator 17 and the position of the Hall elements or pairs 18.1 to 18.4 are invariant against rotations of 90° about the origin of the coordinate system formed by the X-axis and the Y-axis. The two pairs 18.1 and 18.3 lie on the X-axis, the two pairs 18.2 and 18.4 lie on the Y-axis, and all thereof are close to the edge of the magnetic field concentrator 17 where they are flooded by magnetic field lines which in the region of the edge impinge on the magnetic field concentrator 17 or leave said concentrator.

It is the object of the magnetic field concentrator 17 to amplify the magnetic field to be measured at the locations of the sensor elements 8.

The two Hall elements of a pair are coupled in parallel with respect to each other and antiparallel to the Hall elements of the diametrically opposite pair, so that the magnetic field sensor delivers a first output signal which is proportional to the X-component of the magnetic field and a second output signal which is proportional to the Y-component of the magnetic field. The magnetic field sensor can alternatively supply a single output signal which describes the direction of the magnetic field in the plane formed by the magnetic field concentrator 17. The output signal is the angle $\varphi$ for example which the magnetic field encloses with the X-axis.

Figure 8:
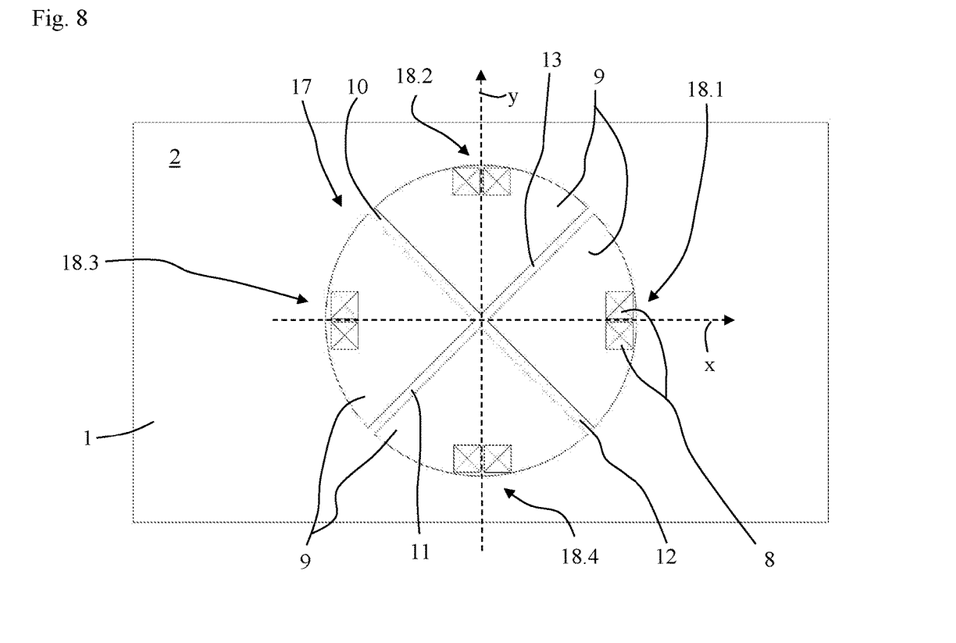
FIGS. 8, 9 show embodiments of a two-dimensional magnetic field sensor according to the invention.
Figure 9:
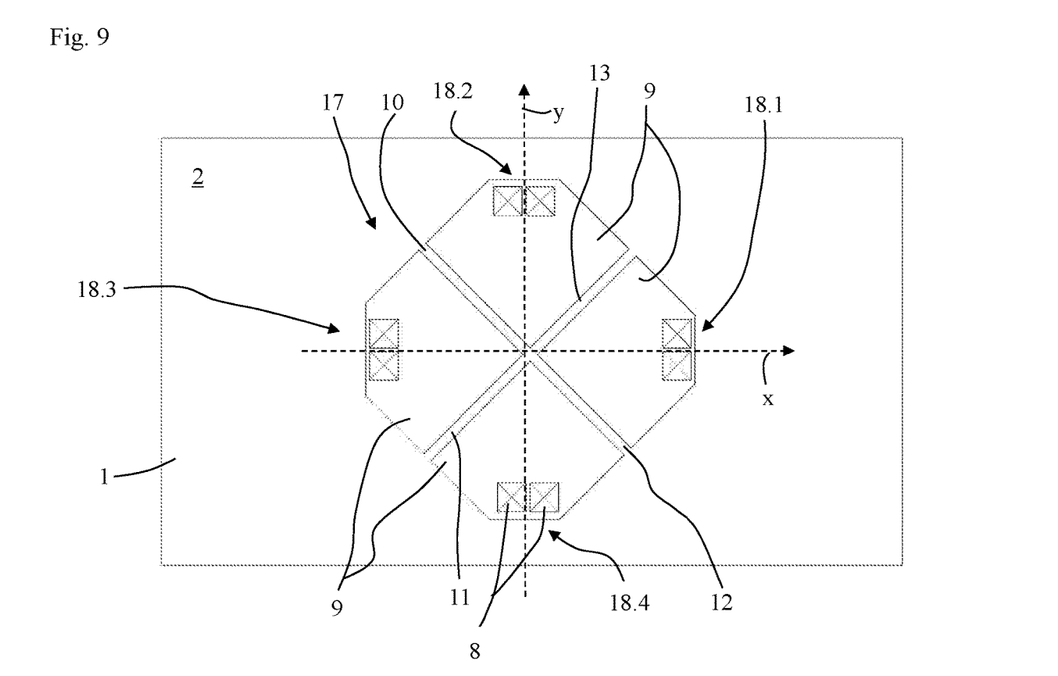

FIGS. 8 and 9 show two preferred embodiments of a two-dimensional magnetic field sensor according to the invention. The magnetic field sensor comprises a support 7, a single magnetic field concentrator 17 and at least two sensor elements. The magnetic field concentrator 17 is arranged on the support 7.

As in the embodiment according to FIG. 7, the support 7 can be a semiconductor chip 1 and the sensor elements 8 can be horizontal Hall elements which are embedded in the active surface 2 of the semiconductor chip 1 at the edge of the magnetic field concentrator 17. The Hall elements are coupled in the same manner as in FIG. 7, so that the magnetic field sensor delivers a first output signal which is proportional to the X-component of the magnetic field and a second output signal which is proportional to the Y-component of the magnetic field, or alternatively delivers a single output signal which indicates the angle $\varphi$ which the magnetic field encloses with the X-axis.

The magnetic field concentrator 17 is disc-shaped in the embodiments according to FIGS. 7 and 8, and octahedral in the embodiment according to FIG. 9. The relevant difference from the known embodiment is that the magnetic field concentrator 17 is subdivided into at least four parts 9 which are separated from each other by gaps 10, 11, 12 and 13. The gaps 10, 11, 12 and 13 have a width $B_1$, $B_2$, $B_3$ and $B_4$. The widths $B_1$, $B_2$, $B_3$ and $B_4$ are very small in comparison with the dimensions of the magnetic field concentrator 17. They are only a few micrometers, typically approximately 5 to 20 μm. The magnetic field concentrator 17 is preferably subdivided into four equal parts 9. The magnetic field concentrator 17 can also be subdivided into differently large and/or more than four parts 9. The sensor elements 8 are not arranged in the gaps 10 to 13, but at locations which are distinctly remote from the gaps 10 to 13 in respect of angle. The sensor elements 8 are preferably located with respect to angle in the middle between two adjoining gaps. This means with respect to FIGS. 8 and 9: the centre of the pairs 18 of two respective sensor elements 8 is disposed at the angles 0°, 90°, 180° and 270°, whereas the gaps 10 to 13 extend from the centre of the magnetic field concentrator 17 along the angles 45°, 135°, 225° and 315°.

The magnetic field sensor delivers a first output signal which is proportional to the X-component of the magnetic field and a second output signal which is proportional to the Y-component of the magnetic field, or alternatively a single output signal which indicates the angle φ which the magnetic field encloses with the X-axis.

In the case of the magnetic field sensors which are shown in FIGS. 8 and 9, the number of the pairs 18 can be reduced from four to two, wherein in this case the sensor elements 8 of the first pair 18.1 are arranged at the angle of 0° and the sensor elements 8 of the second pair 18.2 at the angle of 90°. Although it is often advantageous to use pairs or clusters of sensor elements 8 in order to reduce offset errors or to improve the signal-to-noise ratio for example, it is possible to reduce the number of the sensor elements 8 from eight to two for specific applications, wherein in this case the one sensor element 8 is arranged at the angle of 0° and the other sensor element at the angle of 90°, or optionally at an angle other than 0° and 90°.

Instead of the 90° rotational symmetry which is shown in FIGS. 7 to 9, the magnetic field sensor can also be formed with a 120° rotational symmetry in which the shape of the magnetic field concentrator and the position of the sensor elements are invariant in relation to rotations about 120°. The magnetic field concentrator is then subdivided into at least three parts. The sensor elements are also arranged in this case outside of the gaps, which is typically in respect of angle approximately in the middle between two adjacent gaps. This means the following: the centre of the sensor elements is disposed at the angles of 0°, 120° and 240°, whereas the gaps extend from the centre of the magnetic field concentrator extend along the angles of 60°, 180° and 300°. Additional gaps are possible. Such a magnetic field sensor can be used for example for controlling a three-phase electric motor.

The sensor elements 8 all lie in the region of the edge of the magnetic field concentrator 17. A sensor element 8 which is sensitive to a component of the magnetic field which lies in the plane formed by the magnetic field concentrator 17 must be arranged where the magnetic field lines extend approximately in said plane, i.e. in a region adjacent to the edge outside of the magnetic field concentrator 17, whereas a sensor element 8 which is sensitive to the Z-component of the magnetic field must be arranged where the magnetic field lines extend in the Z-direction, i.e. in an edge region beneath the magnetic field concentrator 17. The sensor elements 8 lie outside of the gaps 10, 11, 12 and 13, so that they are not flooded by field lines which originate from mutually opposite edges of the individual parts 9 of the magnetic field concentrator 17.

The subdivision of the magnetic field concentrator 17 into at least three parts reduces the mechanical stress between the magnetic field concentrator 17 and the support 7 and increases the linearity range.

The gap can be formed as narrow as technologically possible both in one-dimensional and also in the two-dimensional magnetic field sensors, i.e. the width of the gap lies in the range of a few micrometers, typically approximately 5 to 20 μm, and is thus usually smaller than the smallest dimension of a sensor element 8. A horizontal Hall element currently typically has dimensions of 30 μm*30 μm, and an AMR, GMR or fluxgate sensor usually has even greater dimensions. Accordingly, there is insufficient space for a sensor element 8 in the gaps.

The magnetic field concentrators are advantageously applied by means of the electroplating process to the support. They can also be applied by other known methods, e.g. by gluing or structuring a magnetic foil or by sputtering.

Each sensor element can be a (horizontal or vertical) Hall element or a cluster of Hall elements, an AMR (Anisotropic Magnetoresistive Resistance) element, a GMR (Giant Magnetoresistive Resistance) element, a fluxgate sensor, or any other suitable magnetic sensor. The support 7 can be a semiconductor chip which contains the electronic circuits required for the operation of the sensor element or sensor elements and the generation of the output signal. The sensor element or elements can be integrated in the semiconductor chip or applied thereto.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A magnetic field sensor, comprising
a support,
precisely two magnetic field concentrators, each of which has a front face having a length and a depth, is arranged on the support and rigidly connected to the support, the front faces of the two magnetic field concentrators laying oppositely to each other separated from each other by a first gap having a width, and
at least one magnetic sensor element, the at least one magnetic sensor element having a length extending parallel to the lengths of the front faces of the two magnetic field concentrators and a width running parallel to the width of the first gap, wherein
the at least one magnetic sensor element is arranged in a region of the first gap, where the at least one magnetic sensor element is flooded by magnetic field lines which originate from the one magnetic field concentrator and impinge on the other magnetic field concentrator,
each of the two magnetic field concentrators consists of at least two immobile parts which are rigidly connected to the support and separated from each other by second gaps,
a width of the second gaps is smaller than the width of the first gap,
the lengths of the front faces are longer than the length of the at least one magnetic sensor element and longer than the width of the at least one magnetic sensor element, and
an area of each of the parts of the two magnetic field concentrators is bigger than an area of the at least one magnetic sensor element, and
no magnetic sensor element is present in the second gaps.

2. The magnetic field sensor according to claim 1, wherein the support is a semiconductor chip.

3. The magnetic field sensor according to claim 2, wherein the at least one magnetic sensor element is a horizontal Hall sensor, a vertical Hall sensor, an anisotropic magnetoresistive resistance (AMR) sensor, a giant magnetoresistive resistance (GMR) sensor, or a fluxgate sensor.

4. The magnetic field sensor according to claim 1, wherein the at least one magnetic sensor element is a horizontal Hall sensor, a vertical Hall sensor, an anisotropic magnetoresistive resistance (AMR) sensor, a giant magnetoresistive resistance (GMR) sensor, or a fluxgate sensor.

* * * * *

UNITED STATES PATENT AND TRADEMARK OFFICE
CERTIFICATE OF CORRECTION

PATENT NO. : 10,224,478 B2  
APPLICATION NO. : 15/601803  
DATED : March 5, 2019  
INVENTOR(S) : Robert Racz Page 1 of 1

It is certified that error appears in the above-identified patent and that said Letters Patent is hereby corrected as shown below:

On the Title Page

IN THE SECTION ENTITLED "(73) ASSIGNEE"  
Please change the Assignee's name from "Interglass Technology AG (CH)" to --Melexis Technologies SA (CH)--.

Signed and Sealed this  
Twenty-sixth Day of November, 2019

Andrei Iancu  
*Director of the United States Patent and Trademark Office*